United States Patent [19]
Shores

[11] Patent Number: 5,304,419
[45] Date of Patent: Apr. 19, 1994

[54] MOISTURE AND PARTICLE GETTER FOR ENCLOSURES

[76] Inventor: A. Andrew Shores, 212 Carroll Canal, Venice, Calif. 90291

[21] Appl. No.: 848,232

[22] Filed: Mar. 9, 1992

Related U.S. Application Data

[63] Continuation of Ser. No. 549,054, Jul. 6, 1990, abandoned.

[51] Int. Cl.$^5$ .......................... B32B 7/12; C09K 3/10
[52] U.S. Cl. .................................. 428/355; 428/343; 428/351; 252/194; 96/154; 95/902
[58] Field of Search ............... 252/194; 428/355, 343, 428/351; 55/387, 389

[56] References Cited

U.S. PATENT DOCUMENTS

| | | | |
|---|---|---|---|
| 3,074,806 | 12/1972 | Plachenov et al. | 524/789 X |
| 4,013,566 | 3/1977 | Taylor | 55/387 X |
| 4,036,360 | 7/1977 | Deffeyes | 524/871 X |
| 4,081,397 | 3/1978 | Booe | 524/925 X |
| 4,535,098 | 8/1985 | Evani et al. | 524/561 X |
| 4,615,823 | 10/1986 | Tokuyama et al. | 252/194 |
| 4,637,197 | 1/1987 | Banfield | 252/194 X |
| 4,749,392 | 6/1988 | Aoki et al. | 55/387 |
| 4,895,745 | 1/1990 | Vesley et al. | 428/355 X |
| 4,971,196 | 11/1990 | Kitamura et al. | 428/922 X |
| 4,977,009 | 12/1990 | Anderson et al. | 428/76 |

*Primary Examiner*—Daniel Zirker
*Attorney, Agent, or Firm*—Shapiro and Shapiro

[57] ABSTRACT

An enclosure for providing both a moisture free and particle free environment is disclosed. A portion of the inner surface of the enclosure, that comprises an electronic device sealed in a container, is coated with a pressure sensitive adhesive comprising 4–40 percent, by volume, of a solid desiccant. The preferred adhesive is a silicone pressure sensitive adhesive and the preferred desiccant is zeolite.

14 Claims, No Drawings

MOISTURE AND PARTICLE GETTER FOR ENCLOSURES

CROSS-REFERENCE TO RELATED APPLICATION

This application is a continuation-in-part of application Ser. No. 549,054 filed Jul. 6, 1990, now abandoned.

BACKGROUND OF THE INVENTION

This invention relates to enclosures for providing a moisture free and particle free environment by coating an inner surface of a container with a composition having both moisture getter and particle getter properties. It is primarily concerned with maintaining a moisture free and particle free environment in casings and enclosures for semiconductor devices and integrated circuits.

It is difficult to manufacture a hermetic packaging for microelectronic devices with low water vapor content and to maintain the wafer vapor content at a low level during the device's useful lifetime. There are various channels by which water vapor finds its way to the inside of the enclosure:
1. The various seals in packagings are usually not perfect and ambient air, containing moisture, leaks inside the enclosure.
2. Many epoxies used to bond dies and substrates outgas moisture in the packaging with time.
3. The packaging material itself outgasses a certain amount of moisture. Baking prior to sealing is necessary to liberate all the absorbed moisture.
4. The sealing atmosphere has to be moisture free.
5. The testing process for leakage rate may itself introduce moisture inside the package if not done with extreme care.

Another problem that often arises in the manufacture of hermetic devices is the presence of unwanted solid particles on surfaces. Such particles may be constituted of metallic residues from solders or wirebonding, organic residue, from adhesives and fluxes, fibers from cleaning tools such as cotton swabs, airborne particles depositing on the surface, etc. These particles can mechanically damage the microcircuits in the device or cause electrical shorts (wires, solder, conductive epoxy). To minimize such potential problem, the manufacturing is carried out in a so-called "clean room", where the ambient air contains only a very small amount of solid particles. In addition, most processing steps have to be followed up by solvent cleaning to remove residual solid particles from the surfaces. Despite such extensive precautions, failure of parts due to particle contamination is still not entirely eliminated.

The prior art teaches various desiccating solids and liquids and some may be useful in electronic packaging applications. Thus, Aoki et al., U.S. Pat. No. 4,749,392, teach a moisture absorbent sealed between two plastic films of varying permeability. Anderson et al., U.S. Pat. No. 4,977,009, teach a moisture absorbing composite coating made with two solid layers. Plachendov et al., U.S. Pat. No. 3,704,806, disclose a dehumidifying mixture composed of zeolite and a thermosetting plastic binder, which was an improvement over the zeolite+silicone fluid mixture previously used. Evani et al. teach in U.S. Pat. No. 4,535,098 water absorbent compositions of colloidal silica in polymeric binders. Tokuyama et al. teach in U.S. Pat. No. 4,615,823 desiccating salts in a polymer with a fibrous additive. Booe teaches in U.S. Pat. No. 4,081,397 a desiccant for electronic devices which consists of alkaline earth oxides in an elastomeric matrix, such a silicone or polyurethane. Deffeyes teaches in U.S. Pat. No. 4,036,360 a package having a dessicant consisting of a dessicant material dispersed in a film-forming resin. The resin material is taught as a urethane, and the dessicant is taught as a chloride, sulfate, zeolite or clay. Taylor teaches in U.S. Pat. No. 4,013,566 a flexible solid desiccant comprising finely divided molecular seive particles in epoxy.

Some of these teachings may be useful to solve the moisture problem in hermetically sealed enclosures and electronic packages but none of them addresses the problem encountered with residual solid particles.

SUMMARY OF THE INVENTION

It has now been discovered, that certain compositions can successfully address both the moisture and particle problems encountered in sealed enclosures. The key feature of this discovery is that the composition is a pressure sensitive adhesive which contains a solid desiccant.

Therefore, the object of this invention is to provide an enclosure with a moisture free and particle free environment comprising a container for said environment having at least some portion of its inner surface coated with a pressure sensitive adhesive comprising 4–40 volume percent desiccant dispersed therein.

Another object of this invention is to provide a moisture free and particle free environment in a hermetically sealable container for enclosing an electronic device having at least some portion of its inner, surface coated with a pressure sensitive adhesive comprising 4–40 percent, by volume, of a solid desiccant.

Another object of the invention is to provide a method of maintaining a dry and particulate free environment in a hermetically sealable container for enclosing an electronic device by coating at least some portion of the inner surface with a pressure sensitive adhesive comprising 4–40 volume percent of a solid desiccant.

Other objects, advantages and novel features of the invention will become apparent from the detailed description of the invention.

DETAILED DESCRIPTION OF THE INVENTION

The pressure sensitive adhesive useful to prepare the composition of this invention may be selected from a number of generic formulas. Most of them are available commercially:
Silicones (mostly polydimethylsiloxane). In the electronic industry they are often referred to as silicone gels.
Acrylics (mostly homo-or copolymers of otylacrylate and butyl acrylate with minor amounts of vinyl acetate and other acrylate)
Vinyl ether polymers (made mostly with methyl, ethyl or isobutyl vinyl ether)
Polyurethanes
Polychloroprene All these adhesives may contain various additives, such as tackifiers, plasticizers, fillers, stabilizers, colorants and other additives.

Another type of pressure sensitive adhesive contains at least the following 2 ingredients: a hydrocarbon rubber and a tackifier. The rubber could be natural rubber, polyisoprene, styrene butadiene rubber, butyl rubber, polyisobutylene, styrene isoprene block copolymers, styrene butadiene block copolymers and others. Well known tackifiers include rosin, rosin derivatives, hydrocarbon tackifiers and others. An excellent treatise on pressure sensitive adhesives is: D. Satas: "Handbook of Pressure Sensitive Adhesive Technology" Van Nostrand Reinhold, 1982.

A great number of desiccants or drying agents useful for drying gases are available. They may be solids or liquids. Generically they may be silicates, oxides, hydroxides, halides, sulphates, perchlorates, carbonates, activated carbon, sulfuric acid, glycols and other compositions. The mechanism of dehydration may be physical absorption, chemical reaction to form hydrates and chemical reaction to form a new compound. Some may absorb or react with moisture at room temperature but liberate it at higher temperatures.

The desiccant useful to prepare the getter composition of this invention is a solid particulate material. Its average particle size is usually 0.2-100 micrometer, preferably 0.5-10 micrometer. It should be capable of gettering substantial amounts of water vapor, in some cases even at relatively high temperatures, since some devices have high operating temperatures and they are heated to 100° C. on moisture analysis tests.

Examples of such desiccants useful to prepare a composition of this invention are:
- silicon dioxide (silica gel), aluminum oxide (activated alumina);
- calcium sulfate, calcium chloride, copper sulfate; potassium carbonate;
- an alkaline earth oxide, such as barium oxide, calcium oxide, magnesium oxide;
- calcium chloride, calcium bromide, lithium chloride, zinc chloride, zinc bromide.

Zeolites are especially useful since they are high melting, inert, non-corrosive, insoluble solids capable of absorbing large quantities of moisture, even at 100°-150° C.

The preparation of the composition of this invention is rather simple. The desiccant is dispersed in the pressure sensitive adhesive, or a solvent or water solution or dispersion of the adhesive. To obtain a good dispersion, mechanical mixing and shearing is often necessary, sometimes at elevated temperatures to reduce viscosity. The desiccant concentration in the adhesive should be 4-40 volume percent, i.e. volume of desiccant × 100/total adhesive volume.

The composition may be deposited by a hand probe, brush, stencil or screen printing, doctor blading, syringe dispensing or other convenient technique at room temperature or at the melt at elevated temperature. The coating thickness is usually 1-25 mil (1 mil=0.001″), preferably 2-10 mil following evaporation of solvent or water, if such diluent was necessary to incorporate into the formulation for ease of processing. For thermosetting adhesive binders a curing or crosslinking step is then followed.

If the desiccant absorbs water by chemically reacting with it, both mixing and deposition ought to be done under anhydrous conditions to prevent premature absorption and maximize moisture gettering capacity in the hermetic package. For physically absorbing desiccants, such as molecular sieves, a moisture desorption step is necessary at 150°-250° C., or at vacuum, if the moisture absorbing capacity had decreased by moisture absorption during mixing or deposition.

The composition, usually a paste, may be deposited at part or the whole interior surface of the ackaging, or the cover, wall, top of the microcircuit, depending on other intended functions.

Hermetically sealing the packaging is usually done in an inert, bone-dry atmosphere. The packaging is then tested for leak rate and the ones with excess leak rate are rejected. The presence of the composition of this invention in the hermetic package makes the electronic device more reliable.

The practical examples that follow further illustrate in detail the scope of this invention.

EXAMPLE 1

Dow Coring #280A, a 57% total solids solution of a modified polydimethylsiloxane pressure sensitive adhesive, 175.5 g (100 g solids), was weighed out into a 500 ml glass jar and the following ingredients were added while stirring at 1500 rpm:

| | |
|---|---|
| Antifoam | 0.5 g |
| Toluene | 50 |
| Zeolite Molecular Sieve Type 4A, 2 micrometer average diameter | 30 |

Six hybrid circuits prepared from a 1″×1″ aluminum substrate printed with a thick film circuit and having 6 dies was adhesive bonded to the bottom of a hermetically sealable Kovar container and numbered 1-6. The inside surface of the lids of the containers no. 1-3 were coated, using a doctor blading technique, with the silicone solution, dried and cured at 225° C. for 5 minutes. The adhesive covered about one half of the lid's surface area and its thickness was 3 mil. All the containers were then incorporated with small pieces of gold wires (used for wire bonding the dies), solder balls, small chunks of epoxy adhesive and tiny fibers from a Q-tip. The packages were then seam sealed and screened at 150° C. for 168 hours for "burn-in".

Moisture content inside the package was tested by a mass spectroscopy Residual Gas Analysis (RGA) technique and the presence of solid particles was tested by Particle Impact Noise (PIND) test:

| | Moisture Parts Per Million | Solid Particles |
|---|---|---|
| Hybrid No. 1-3 | All below 100 | Not detected |
| Hybrid No. 4-6 | 5500, 4200, 8300 | Yes |

EXAMPLES 2-7

The following adhesive/desiccant pair combinations were evaluated and found to be functional, as in Example 1 as moisture getters and particle getters. Coating thicknesses ranged 2-10 mil and desiccant content from 4 to 40 volume percent.

| Example | Pressure Sensitive Adhesive | Desiccant |
|---|---|---|
| 2 | Copolymer 2-ethylhexyl acrylate/3% acrylic acid | Activated Alumina |
| 3 | Polymethylvinyl ether | Silica Gel |
| 4 | Polyurethane from polypropylene glycol and toluena dissocyanate | Silica Gel |
| 5 | Natural rubber/rosin/ = 1/1 | Zeolite 13X |
| 6 | Styrene/Isoprene/Styrene Block Capolymer with 50% Polyterpene | Calcium Sulfate |
| 7 | Polychloroprene + 50% Rosin Ester | Activated |

| Example | Pressure Sensitive Adhesive | Desiccant |
|---|---|---|
| | | Alumina |

I claim:

1. A hermetically sealed enclosure housing an electronic device and having an inner surface provided on at least some portion thereof with a coating of a pressure sensitive adhesive containing 4-40 volume percent of a finely particulated solid desiccant having an average particle size of 0.2-100 micrometer, said coating having a thickness of 1-25 mil and being effective to maintain an environment within the enclosure substantially moisture-free and substantially devoid of free solid particles.

2. An enclosure as in claim 1 wherein said desiccant is a zeolite.

3. An enclosure as in claim 1 wherein said desiccant is selected from the group consisting of activated alumina, silica gel, calcium sulfate, calcium chloride, calcium bromide and lithium chloride.

4. An enclosure as in claim 1 wherein said desiccant is selected from the group consisting of an alkaline earth oxide, potassium carbonate, copper sulfate, zinc chloride and zinc bromide.

5. An enclosure as in claim 1 wherein said pressure sensitive adhesive is a silicone.

6. An enclosure as in claim 5, wherein said desiccant is a zeolite.

7. An enclosure as in claim 1, wherein said pressure sensitive adhesive is selected from the group consisting of acrylics, polyvinylethers, polyurethanes and rubber-tackifier mixtures.

8. An enclosure as in claim 1, wherein the coating thickness is 2-10 mil.

9. An enclosure as in claim 8, wherein the average particle size is 0.5-10 micrometer.

10. An enclosure as in claim 1, wherein the average particle size is 0.5-10 micrometer.

11. A hermetically sealed enclosure housing an electronic device and having an inner surface at least some portion of which is provided with a coating of a pressure sensitive adhesive which is effective to maintain an environment within the enclosure substantially devoid of free solid particulate contaminants, said coating having a thickness of 1-25 mil and containing a finely particulated solid desiccant having an average particle size of 0.2-100 micrometer in an amount effective to maintain said environment substantially moisture-free.

12. An enclosure as in claim 11, wherein the coating thickness is 2-10 mil.

13. An enclosure as in claim 11, wherein the average particle size is 0.5-10 micrometer.

14. An enclosure as in claim 13, wherein said coating has a thickness of 2-10 mil.

* * * * *